(12) United States Patent
Shaheen et al.

(10) Patent No.: US 7,378,331 B2
(45) Date of Patent: May 27, 2008

(54) METHODS OF VERTICALLY STACKING WAFERS USING POROUS SILICON

(75) Inventors: Mohamad Shaheen, Portland, OR (US); Peter G. Tolchinsky, Beaverton, OR (US); Irwin Yablok, Portland, OR (US); Scott R. List, Overijse (BE)

(73) Assignee: Intel Corporation, Santa Clara, CA (US)

( * ) Notice: Subject to any disclaimer, the term of this patent is extended or adjusted under 35 U.S.C. 154(b) by 372 days.

(21) Appl. No.: 11/025,131

(22) Filed: Dec. 29, 2004

(65) Prior Publication Data

US 2006/0138627 A1 Jun. 29, 2006

(51) Int. Cl.
*H01L 21/30* (2006.01)
*H01L 21/46* (2006.01)

(52) U.S. Cl. .................. 438/458; 438/455; 438/478; 438/507; 257/E27.137; 257/E27.144; 257/E27.161

(58) Field of Classification Search .................. 438/458
See application file for complete search history.

(56) References Cited

U.S. PATENT DOCUMENTS

| | | | | |
|---|---|---|---|---|
| 5,854,123 A | * | 12/1998 | Sato et al. .................. | 438/507 |
| 5,891,757 A | * | 4/1999 | Ohno .......................... | 438/149 |
| 6,100,570 A | * | 8/2000 | Saito .......................... | 257/446 |
| 6,657,295 B2 | * | 12/2003 | Araki .......................... | 257/712 |
| 6,683,663 B1 | * | 1/2004 | Hadley et al. ................ | 349/45 |
| 7,091,108 B2 | * | 8/2006 | Tolchinsky et al. ......... | 438/458 |
| 2003/0067056 A1 | * | 4/2003 | Araki .......................... | 257/635 |

* cited by examiner

*Primary Examiner*—Walter Lindsay, Jr.
*Assistant Examiner*—Abdulfattah Mustapha
(74) *Attorney, Agent, or Firm*—Buckley, Maschoff & Talwalkar LLC

(57) ABSTRACT

A method and article to provide a three-dimensional (3-D) IC wafer process flow. In some embodiments, the method and article include bonding a device layer of a multilayer wafer to a device layer of another multilayer wafer to form a bonded pair of device layers, each of the multilayer wafers including a layer of silicon on a layer of porous silicon (SiOPSi) on a silicon substrate where the device layer is formed in the silicon layer, separating the bonded pair of device layers from one of the silicon substrates by splitting one of the porous silicon layers, and separating the bonded pair of device layers from the remaining silicon substrate by splitting the other one of the porous silicon layers to provide a vertically stacked wafer.

30 Claims, 6 Drawing Sheets

METHODS OF VERTICALLY STACKING WAFERS USING POROUS SILICON

BACKGROUND

Vertical integration, that is, the stacking of multiple dies, has been proposed as a way to increase the density of integrated circuits. Constraints in vertical integration include the minimum thickness of each stacked component and the minimum thickness of the substrate of each component. An IC wafer may be thinned to an extent by grinding back the substrate of the IC. However, grinding can introduce unwanted stresses and dislocations on the wafer that can negatively impact IC performance and yield. An IC device wafer may typically be about 750 microns thick. However, the device layer may only be about 2-3 microns thick. A significant amount of the IC wafer, typically silicon, may therefore be unused or wasted material.

DETAILED DESCRIPTION

The several embodiments described herein are solely for the purpose of illustration. Embodiments may include any currently or hereafter-known versions of the elements described herein. Therefore, persons in the art will recognize from this description that other embodiments may be practiced with various modifications and alterations.

Some embodiments hereof provide a manufacturing process for producing an ultra-thin three-dimensional (3-D) vertically stacked IC. In some embodiments, the IC is formed using a multilayer wafer including a layer of silicon on a layer of porous silicon (SiOPSi) on a silicon substrate. In other embodiments, the IC is formed using a multilayer wafer including silicon on an insulator on porous silicon (SiOIOPSi) on a silicon substrate.

Figure 1:
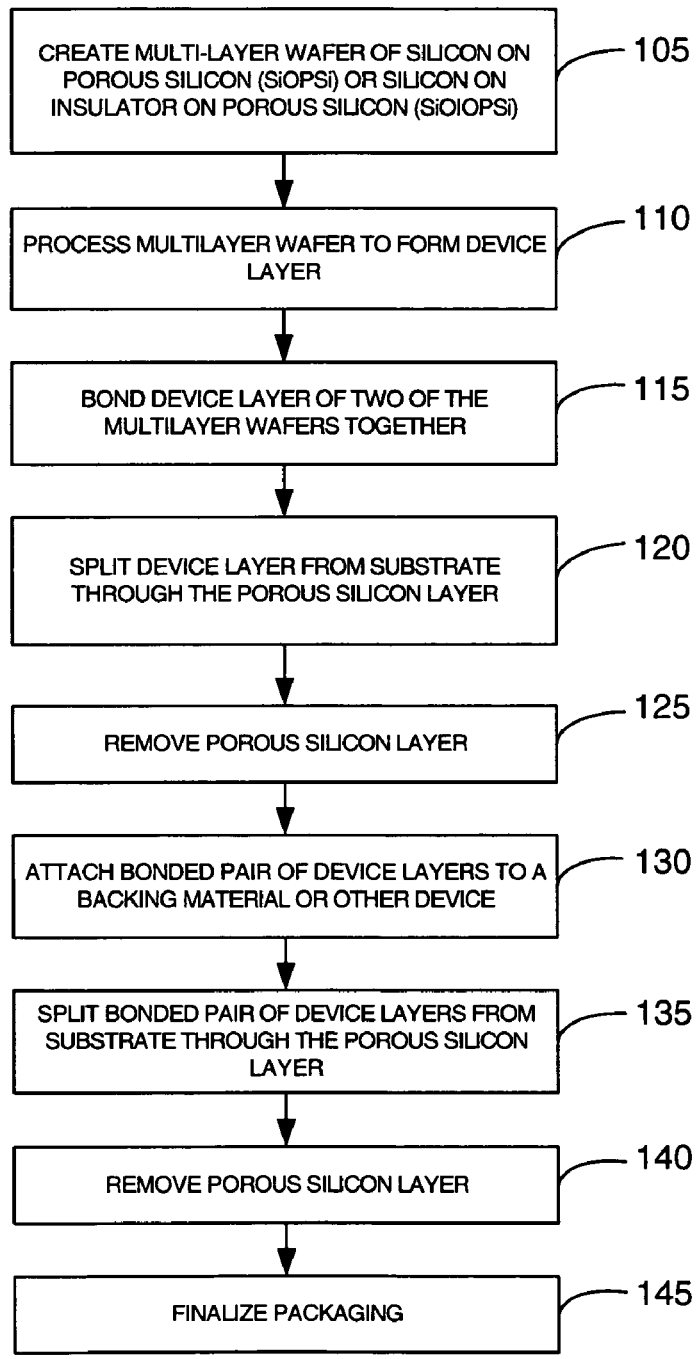
FIG. 1 is an exemplary flow diagram of a method to provide a vertically stacked wafer using a wafer of silicon on porous silicon (SiOPSi), in accordance with some embodiments hereof.

Referring to FIG. 1, there is shown an exemplary flow diagram of a manufacturing process for producing a vertically stacked IC in accordance with some embodiments hereof, generally represented by the reference numeral 100. Process 100 may be performed by any combination of hardware, software, and/or firmware. According to some embodiments, instructions for implementing process 100 may be stored in executable code. The code may be stored on any suitable article or medium that is or becomes known. Process 100 may be further understood by also referring to FIGS. 2A-2H in conjunction with the following discussion of the flow diagram of FIG. 1.

Figure 2A:
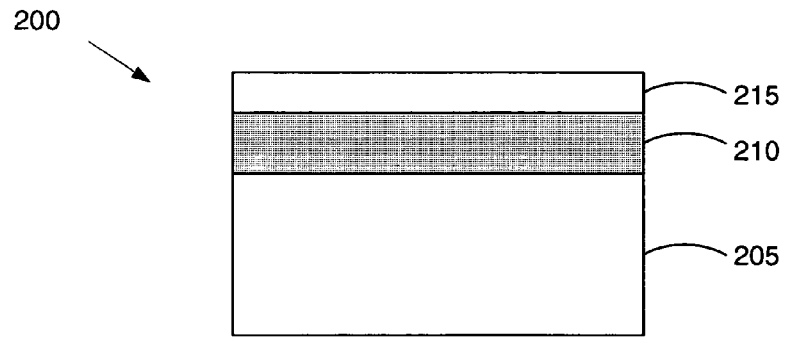
FIGS. 2A-2H are exemplary illustrations of a vertically stacked wafer, at various stages of the process of FIG. 1.

Initially, at 105, a multilayer wafer 200 including silicon 215 on porous silicon 210 (SiOPSi) on a silicon substrate 205 is created or obtained for use in process 100. Multilayer wafer 200 may be produced or formed using any number of methods of manufacturing that result in a multilayer wafer suitable and compatible with the various aspects and embodiments hereof. FIG. 2A provides an exemplary illustration of multilayer wafer 200 described at 105, including silicon layer 215 on top of porous silicon layer 210 that is in turn on top of silicon substrate 205.

In some embodiments, multilayer wafer 200 may be obtained by forming a porous silicon layer on a surface of a single crystal silicon wafer. The porous silicon may be fabricated by an electrochemical anodization of silicon in a hydrofluoric acid-based electrolyte. Porous silicon is composed of a silicon skeleton permeated by a network of pores. The characteristics of a particular porous silicon layer may be described in a number of ways, including the porosity and/or thickness of the layer.

In some embodiments, silicon layer 215 is about 2 microns thick. Silicon layer 215 may be formed by treating a top layer of porous silicon 210 and depositing an epitaxial layer of silicon thereon may used to form silicon layer 215.

Figure 2B:
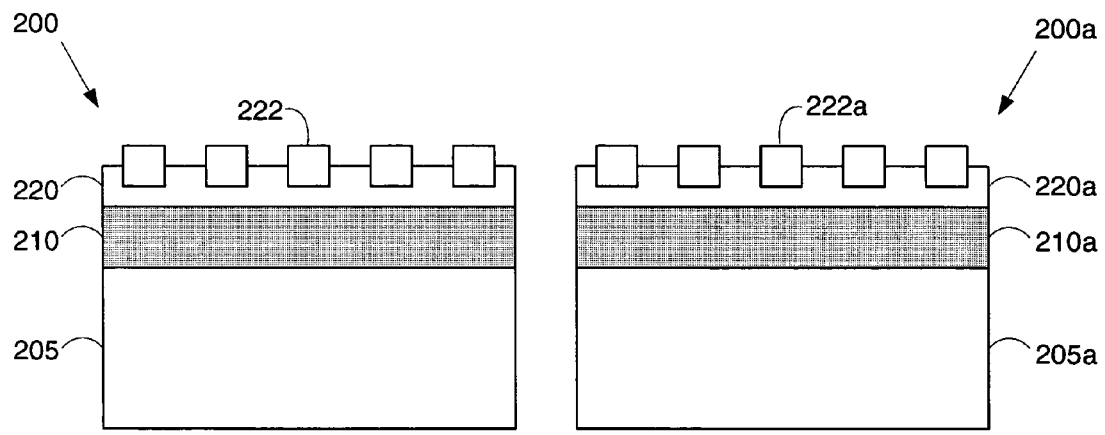

At 110, multilayer wafer 200 is processed to form device layer 220. Multilayer wafer 200 is processed through a manufacturing flow, conventional or otherwise, to form device layer 220 in silicon layer 215. FIG. 2B depicts two multilayer wafers 200, 200a. As illustrated in FIG. 2B, the processed silicon layer that includes contacts 222 is hereinafter referred to as device layer 220. It should be appreciated that device layer 220 may include contacts 222 and other IC device layer features (not shown) therein such as, for example, transistors, diodes, interconnects, traces, vias, etc. Device layer 220 is on top of porous silicon layer 210.

Device layer 220, in some embodiments, may be about 0.1 um thick. Silicon substrate 205, in some embodiments, can be about 775 microns thick for 300 mm wafers. Silicon substrate 205 provides a support mechanism for handling and manipulating multilayer wafers 200, 200a during the processing (i.e., development) of device layers 220, 220a.

In some embodiments hereof, device layers 220, 220a are obtained by a similar manufacturing process. In some embodiments, the manufacturing process for the two device layers 220, 220a can differ. Further, in some embodiments, device layers 220, 220a and the ICs formed therein have common design constraints. The common design constraints allow for compatible interconnection and operation between device layers 220, 220a.

Figure 2C:
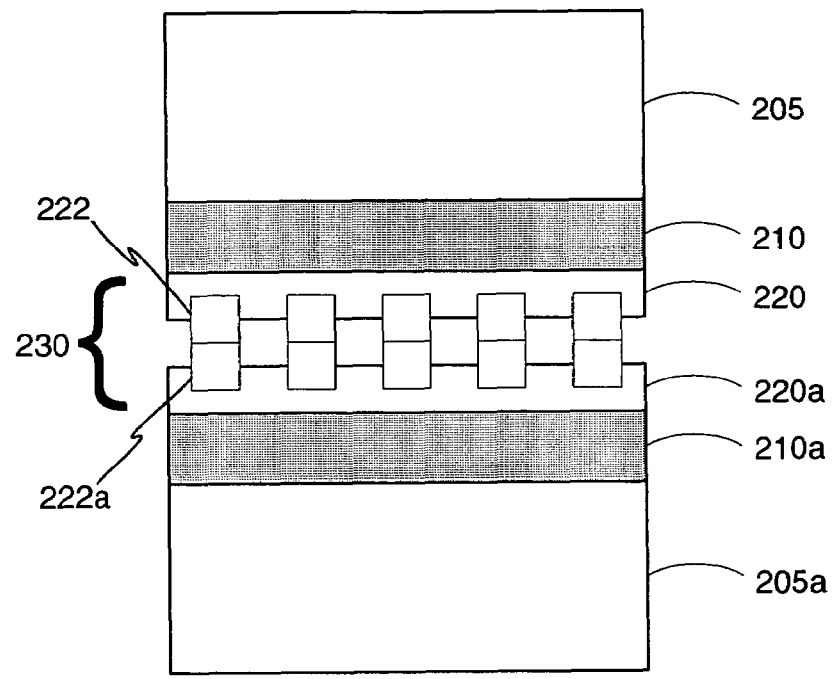

At 115, illustrated pictorially in FIG. 2C, device layers 220, 220a of the two multilayer wafers 200, 200a are bonded together, face-to-face, to form bonded pair 230. In some embodiments, the bonding may be accomplished using contact to contact diffusion bonding. In some embodiments hereof, the bonding process may use an adhesive. In some embodiments, contacts 222 of device layer 220 are bonded to corresponding contacts 222a of device layer 220a.

Figure 3:
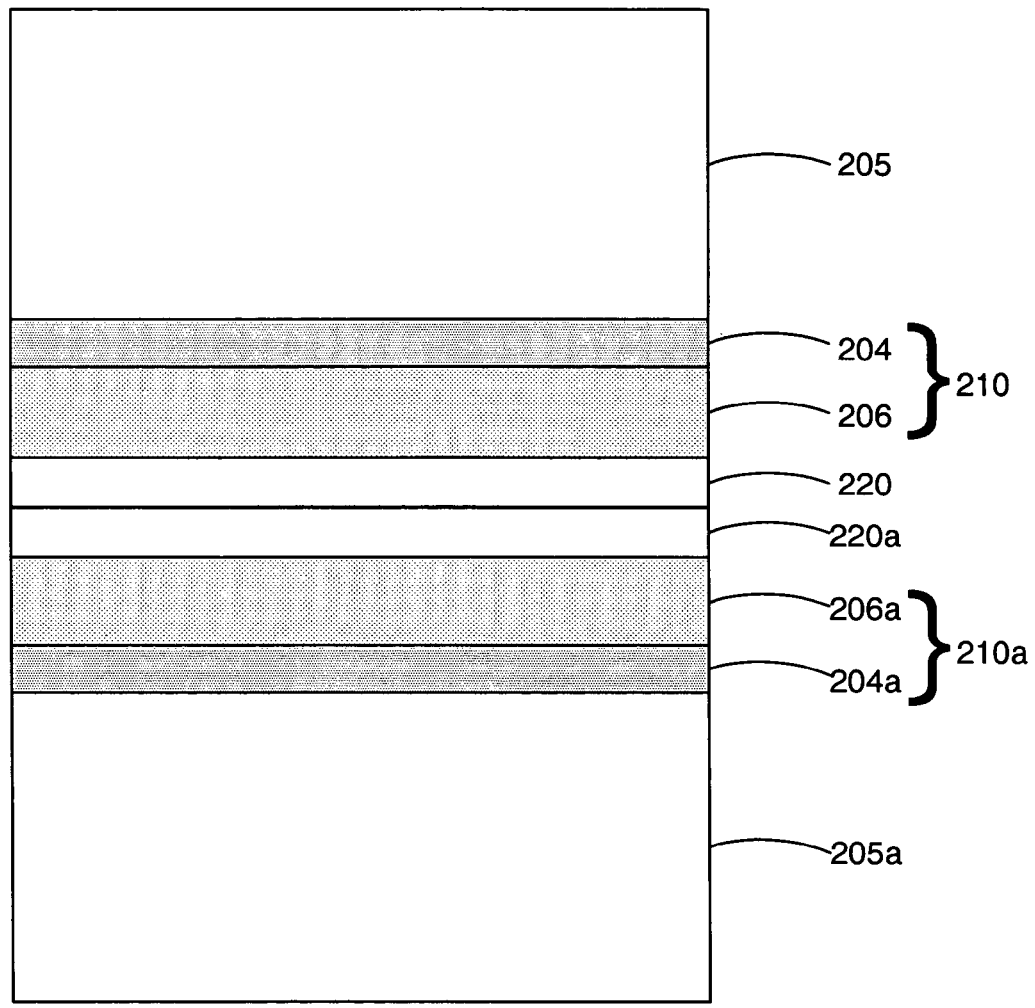
FIG. 3 is an exemplary illustration of a bonded pair of device layers, in accordance with some embodiments herein.

FIG. 3, in accordance with some embodiments herein, depicts a bonded pair of device layers 220, 220a on respective porous silicon layers 210, 210a and silicon substrates 205, 205a, respectively. Porous silicon layer 210 is shown to include a first porous layer 206 and a second porous layer 204. Porous silicon layer 210a includes a first porous layer 206a and a second porous layer 204a. In some embodiments, first porous layer 206, 206a may be about 1 micron to about 5 microns thick and may exhibit first pore sizes (i.e., porosity), and second porous layer 204, 204a may be about 5 microns to about 10 microns thick and may exhibit second pore sizes that are different from the first pore sizes. In the example of FIG. 3, device layers 220, 220a are about 1-5 microns thick each, for a total bonded pair thickness of about 5 microns to about 10 microns thick.

Figure 2D:
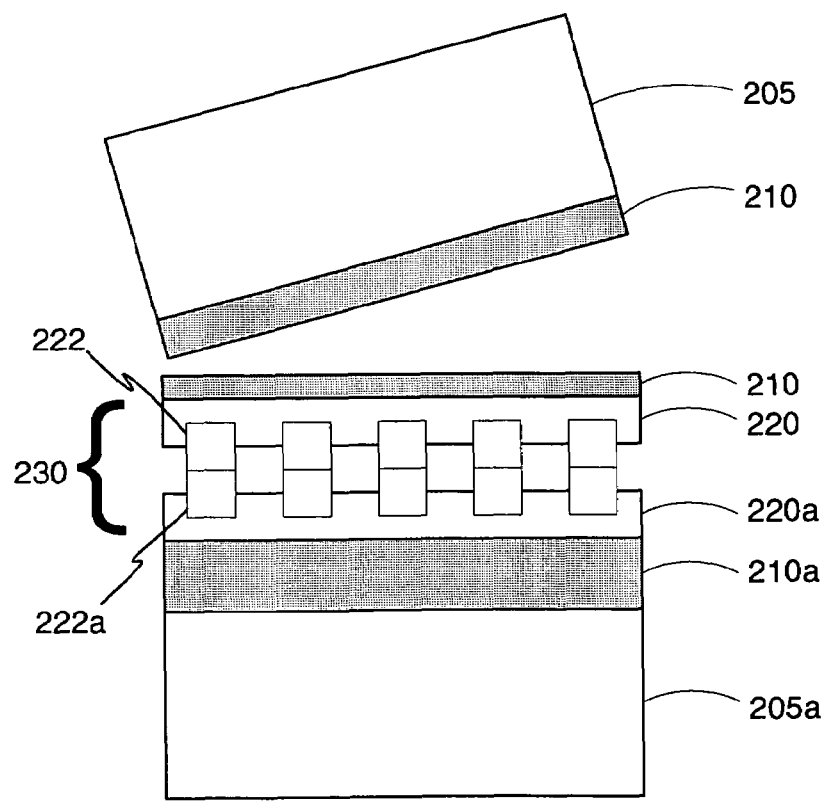

At 120, substrate 205 is separated from device layer 220. As shown in FIG. 2D, substrate 205 is split from device layer 220 through porous silicon layer 210. In some embodiments, substrate 205 is split from device layer 220 using a water jet technique.

As described above with respect to FIG. 3, porous layers 210, 210a includes multiple layers of differing pore size and porosity. The layers of differing porosity are clearly defined and meet at a defined transition therebetween. The force required to penetrate porous silicon of a given porosity is stable and predictable. Therefore, the porous silicon can be split or cleaved along the transition between interfacing layers of porous silicon having differing porosity in a controlled and precise manner. The splitting or cleaving of porous layer 220, 220a can therefore be precisely controlled and limited to the transition between interfacing layers of porous silicon having different porosities.

Figure 2E:
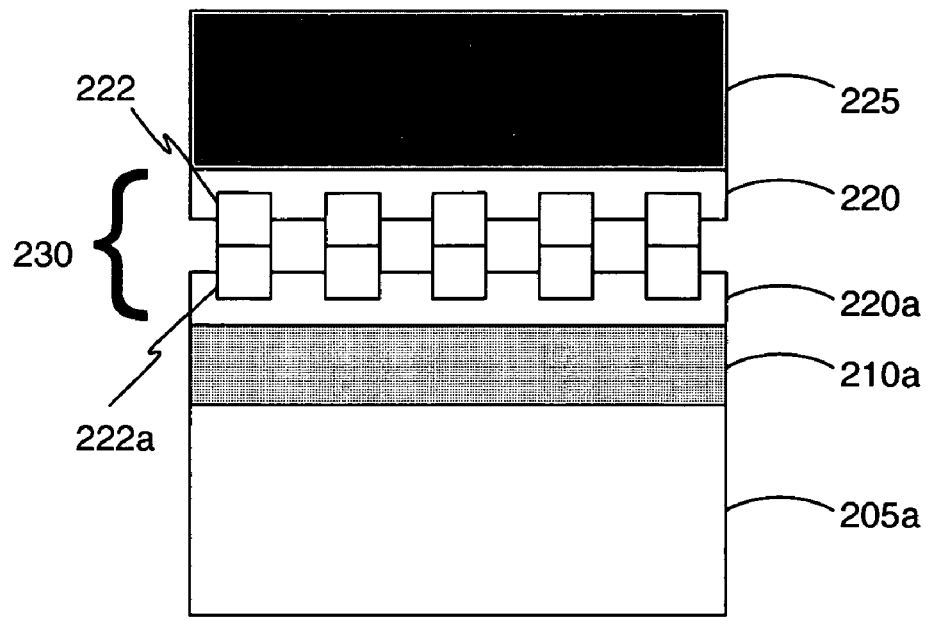

At 125, a remaining portion of porous silicon layer 210 is removed from bonded pair 230. At 130, porous silicon layer 210 is attached to, for example, a backing material 225 as shown in FIG. 2E. Backing material 225 is temporarily attached to bonded pair 230 to provide an additional measure of stiffness to the multilayer wafer for further processing and handling thereof. In some embodiments hereof, backing material 225 may include another IC, such as, a device layer or bonded pair of device layers.

Figure 2F:
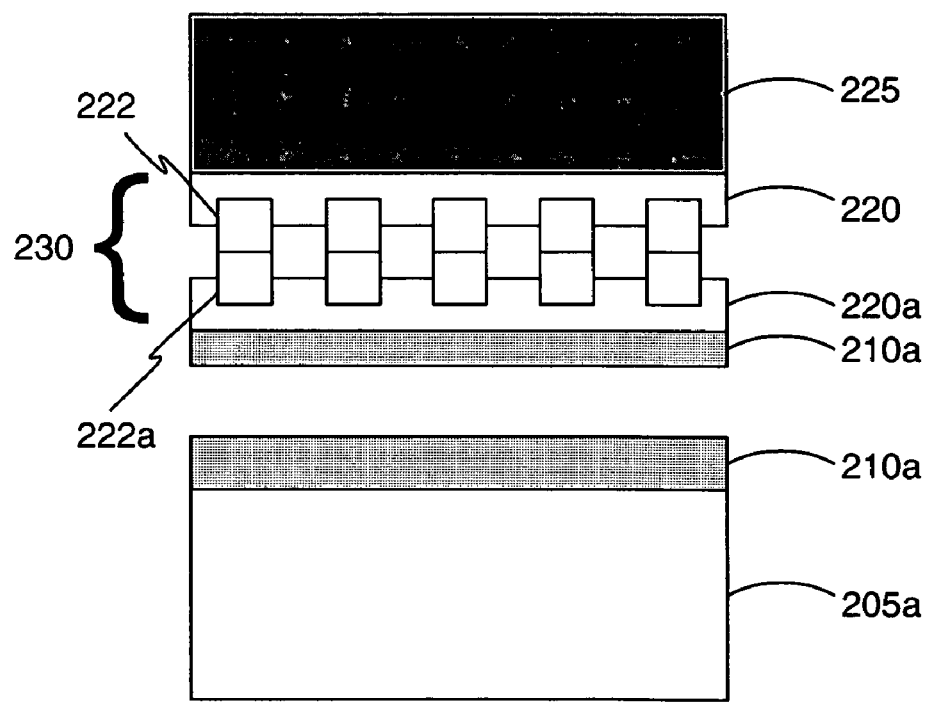

At 135, silicon substrate 205a is split from device layer 220a through porous silicon layer 210a. In some embodiments, silicon substrate 205a is split from device layer 220a and bonded pair 230 using a water jet technique similar to that discussed above regarding silicon substrate 205. Operation 135 is depicted in FIG. 2F where bonded pair 230 is shown separated (i.e., split) from silicon substrate 205a.

Figure 2G:
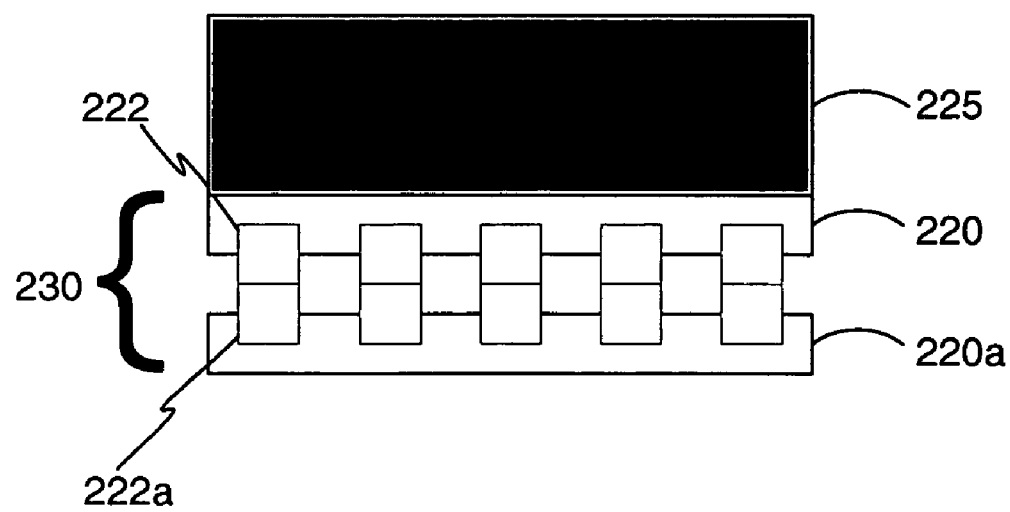

At 140 and FIG. 2G, the remnants of porous silicon 210a are removed from device layer 220a in, for example, a manner similar to that discussed above regarding porous silicon 210.

Figure 2H:
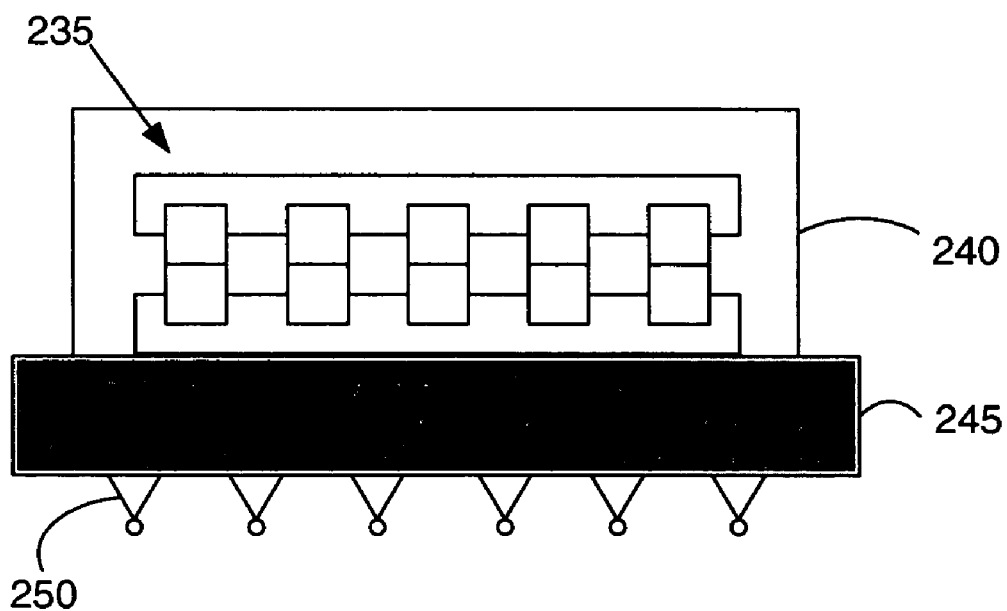

At 145, bonded pair 230 is singulated. That is, bonded pair 230 is divided into individual dies. Packaging of the singulated device 235 is finalized by, for example, bonding device 235 to packaging 240, removing backing material 225 that was previously temporarily attached to bonded pair 230, and bonding device 235 to substrate 245. An example of a vertically stacked IC device in accordance with some embodiments hereof is shown in FIG. 2H. As shown, substrate 245 has a number of connection pads 250 attached thereto.

Some embodiments of the foregoing may provide a vertically stacked, ultra-thin IC device without the need to grind back the silicon substrate (e.g., 205, 205a). Silicon substrates 205, 205a of the embodiments herein are used to support the IC device layers 220, 220a during the processing thereof and subsequently separated therefrom using water jet or other technique(s) through the porous silicon (e.g. 210, 210a). Accordingly, a vertically stacked, ultra-thin bonded pair of device layers from about 1000 Angtroms to about 20 microns thick may be obtained from SiOPSi multilayered wafers.

Some embodiments may reduce the thickness of the stacked IC wafers and thereby provide improved vertical integration of IC devices and packages. The reduced thicknesses of the vertically stacked ultra-thin wafers provided in accordance with some embodiments herein facilitate heat dissipation by eliminating unused silicon having relatively low thermal conductivity from the wafer. In some embodiments, the device layer of the vertically stacked ultra-thin wafers may be placed in closer thermal contact with thermal conductors, heat sinks, heat spreaders, and the like to dissipate heat more efficiently than heretofore device layers.

In some embodiments, the methods for providing the vertically stacked ultra-thin wafers are more efficient and useful (i.e., less wasteful) of resources since the provided vertically stacked 3-D wafers may include very little unused silicon in the device layers thereof.

The several embodiments described herein are solely for the purpose of illustration. Persons in the art will recognize from this description that other embodiments may be practiced with modifications and alterations limited only by the claims.

What is claimed is:

1. A method comprising:
   bonding a multilayer wafer including a device layer to another multilayer wafer including a device layer, face-to-face, to form a bonded pair of device layers, each of the multilayer wafers including a layer of silicon on a layer of porous silicon on a silicon substrate wherein the device layer is formed in the silicon layer;
   separating the bonded pair of device layers from one of the silicon substrates by splitting one of the porous silicon layers; and
   separating the bonded pair of device layers from the remaining silicon substrate by splitting the other one of the porous silicon layers.

2. The method of claim 1, wherein the multilayer devices further comprise interconnect layers.

3. The method of claim 2, wherein the interconnect layers of the multilayer wafers are bonded together to form a bonded pair of interconnected layers.

4. The method of claim 1, further comprising creating the multilayer wafers.

5. The method of claim 4, wherein the creating comprises forming the layer of porous silicon on the silicon substrate and forming the layer of silicon on the layer of porous silicon.

6. The method of claim 1, further comprising packaging the bonded pair of device layers.

7. The method of claim 1, wherein the porous silicon layer is split by directing a water jet between layers of the porous silicon layer having differing porosity.

8. The method of claim 1, further comprising singulating the bonded pair of device layers.

9. The method of claim 1, wherein the bonded pair of device layers is less than about 20 microns thick.

10. The method of claim 9, wherein the bonded pair of device layers is about 10 angstroms to about 3 microns thick.

11. The method of claim 1, wherein the splitting of the porous silicon layer occurs along a transition of porous silicon layers having differing porosities.

12. The method of claim 1, wherein at least one of the multilayer wafers comprises a silicon layer on an insulator on a porous silicon layer (SiOIOpSi) on a silicon substrate.

13. The method of claim 1, further comprising processing the multilayer wafers to form the device layer in the silicon layer.

14. The method of claim 1, further comprising removing a portion of the split porous silicon layer from the bonded pair.

15. The method of claim 1, further comprising temporarily attaching the bonded pair of device layers to a backing material.

16. An article, comprising:
   a storage medium having stored thereon instructions that when executed by a machine result in the following:
   bonding a multilayer wafer including a device layer to another multilayer wafer including a device layer, face-to-face, to form a bonded pair of device layers, each of the multilayer wafers including a layer of silicon on a layer of porous silicon on a silicon substrate wherein the device layer is formed in the silicon layer;

separating the bonded pair of device layers from one of the silicon substrates by splitting one of the porous silicon layers; and separating the bonded pair of device layers from the remaining silicon substrate by splitting the other one of the porous silicon layers.

17. The article of claim 16, wherein the multilayer devices further comprise interconnect layers.

18. The article of claim 17, wherein the interconnect layers of the multilayer wafers are bonded together to form a bonded pair of interconnected.

19. The article of claim 16, further comprising creating the multilayer wafers.

20. The article of claim 19, wherein the creating comprises forming the layer of porous silicon on the silicon substrate and forming the layer of silicon on the layer of porous silicon.

21. The article of claim 16, further comprising packaging the bonded pair of device layers.

22. The article of claim 16, wherein the porous silicon layer is split by directing a water jet between layers of the porous silicon having differing porosity.

23. The article of claim 16, further comprising singulating the bonded pair of device layers.

24. The article of claim 16, wherein the bonded pair of device layers is less than about 20 microns thick.

25. The article of claim 24, wherein the bonded pair of device layers is about 10 angstroms to about 3 microns thick.

26. The article of claim 16, wherein the splitting of the porous silicon layer occurs along a transition of porous silicon layers having differing porosities.

27. The article of claim 16, wherein at least one of the multilayer wafer comprises a silicon layer on an insulator on a porous silicon layer (SiOIOpSi) on a silicon substrate.

28. The article of claim 16, further comprising processing the multilayer wafers to form the device layer in the silicon layer.

29. The article of claim 16, further comprising removing a portion of the split porous silicon layer from the bonded pair.

30. The article of claim 16, further comprising temporarily attaching the bonded pair of device layers to a backing material.

* * * * *